United States Patent [19]

Steigerwald

[11] 4,038,513
[45] July 26, 1977

[54] PROCESS FOR ENERGY BEAM PERFORATION, ESPECIALLY ELECTRON BEAM PERFORATION, OF MULTI-LAYERED ARTIFICIAL LEATHER

[75] Inventor: Karl Heinz Steigerwald, Starnberg, Germany

[73] Assignee: Steigerwald Strahltechnik GmbH, Munich, Germany

[21] Appl. No.: 618,520

[22] Filed: Oct. 1, 1975

[30] Foreign Application Priority Data

Oct. 16, 1974   Germany .............................. 2449264

[51] Int. Cl.² .............................................. B23K 15/00
[52] U.S. Cl. .................... 219/121 EM; 219/121 LM; 428/137
[58] Field of Search .... 219/121 EM, 121 L, 121 LM; 36/3 R, 3 A, 44; 428/137; 264/22

[56] References Cited

U.S. PATENT DOCUMENTS

| | | | |
|---|---|---|---|
| 1,787,487 | 1/1931 | Masuda | 36/44 |
| 3,215,552 | 11/1965 | Halcomb et al. | 428/137 |
| 3,253,598 | 5/1966 | Spanel | 428/137 |
| 3,371,190 | 2/1968 | Meyer | 219/121 EM |
| 3,594,261 | 7/1971 | Broerman | 219/121 LM |

Primary Examiner—J. V. Truhe
Assistant Examiner—Clifford C. Shaw
Attorney, Agent, or Firm—Andrus, Sceales, Starke & Sawall

[57] ABSTRACT

A process for the energy beam perforation of multi-layered artificial leather, which has an essentially impervious top layer and a support layer which is pervious to gas, wherein perforation is carried out with the support layer turned towards the beam.

13 Claims, 3 Drawing Figures

PROCESS FOR ENERGY BEAM PERFORATION, ESPECIALLY ELECTRON BEAM PERFORATION, OF MULTI-LAYERED ARTIFICIAL LEATHER

BACKGROUND OF THE INVENTION

The invention relates to a process for energy beam perforation, especially electron beam perforation of multi-layered artificial leather, which has an essentially impervious top layer and a support layer which is pervious to gas, preferably of fleece or cloth.

It is well known to perforate multi-layered artificial leather with energy beams, especially electron beams, and thereby make it to an extent previous to gas, so that properties of use and support of the artificial leather for footwear, seating upholstery and the like are considerably improved and made more similar to natural leather.

Up to the present time, the process has been such that perforation was carried out from the impervious top side, i.e. this top side was turned towards the beam source during perforation. For this, the ray characteristics were set preferably so that the preforation holes ended in the support layer which was moreover gas pervious, with the result that damage to this support layer was as far as possible avoided. On account of this possibility of sparing the support layer, which contributes to the strength of the artificial leather, perforation has up to the present time been carried out exclusively in the way described with the top side turned towards the beam source.

SUMMARY OF THE INVENTION

It has now been found, surprisingly, that perforation in the reverse direction i.e. with the support layer therefore turned towards the beam source, offers unexpected important advantages which make this new method of perforation seem superior. Thus, it was shown that in this way the discolourations regarded hitherto as unavoidable in the area of perforation, now only occur to a very reduced extent, so that even with light artificial leathers no disturbing colour removal in the areas of perforation is to be seen. This can above all be traced back to the fact that with the new process the intensity of the beam on reaching the outer top surface of the top side is already considerably reduced; in contrast to this, the beam intensity still had to be relatively high just at this point with the earlier processes, since the whole material thickness had to be bored through from there. Closely connected with this advantage is the fact that the perforation bores produced according to the new process extend from the outside of the top layer to the support layer, so that in spite of a relatively small opening in the outside of the top layer a relatively small resistance to flaow is obtained; this contrasts with the hitherto known process, with which the reverse conditions existed, that is the largest cross section of the perforation bore existed just in the outer top surface of the top layer. The specified required increase in the diameter of the perforation hole in the direction towards the support layer can still be easily increased by using a conical beam, — a certain conicity of the beam is moreover mostly present.

Furthermore, with the new process the important advantage is shown, that the relatively large openings, which are produced on the entry side of the beam in the support layer, prevent subsequent obstruction of the perforation bores through swelling of the support layer material.

In addition it has been surprisingly shown that in comparison with the hitherto existing perforation method the strength of the perforated material is even more favourable, while possessing the same gas previousness, although with the new process the support layer is fully perforated. This can be traced back to the fact that resistance to flow as caused by residual support layer material are avoided and the perforation bores can therefore be made more narrow and/or with smaller distribution density.

Furthermore, it has been surprisingly shown that the previousness in relation to water in liquid phase is also less with the perforated artificial leather according to the invention than with the conventional perforated artificial leather, provided the gas perviousness is the same. This can presumably be traced back to the hole cross section decreasing towards the top side.

Finally, other advantages result with the perforation of already impressed artificial leather, for example of artificial leather blanks, which are intended for shoe top parts and have impressed thickenings, elevations and similar. With the hitherto existing perforation process with the top side turned towards the beam, the distance between the beam splitter, which is usually interposed between the beam source and the artificial leather blanks necessarily depended on the presence and the thickness of possible elevations of the top side. Also it was inevitable that the elevations were also bored during perforation, although perhaps on account of their greater thickness they could not be fully perforated. On the other hand, with the new process with the support layer turned towards the beam, perforation of the elevations does not occur at all with corresponding setting of the beam, and the elevations also have no influence on the required distance between the artificial leather to be perforated and the beam source.

As a further advantage it must be mentioned that artificial leather which has been perforated according to the new process normally does not need to be cleaned on the top side; in contrast to this, the top side had to be cleaned with the hitherto existing process.

Furthermore, the advantage must also be mentioned that a smaller hole density is sufficient, because, as mentioned, the resistances to flow in the perforation holes are less than with comparable perforations according to the old process. Thus, it is sufficient for obtaining an adequate gas perviousness [for shoe top leather e.g. approx. 250 $cm^3/(cm^2 \times min)$ with 20 mm column of water pressure difference,] if hole density of 25 to 40 holes per $cm^2$ are used; the openings lying on the outside of the top layer can thereby still be so small that they are not visible. In contrast to this, with the old process, with the top side turned towards the beam, hole densities between 150 and 300 holes per $cm^2$ are necessary, where the hole diameter must lie in the region of 0.13 to 0.15 mm.

Altogether, there results from the process according to the invention, a surprising number of advantages, which make the process according to the invention seem superior.

BRIEF DESCRIPTION OF THE DRAWINGS

The invention will now be further described, by way of example, with reference to the accompanying drawings, in which:-

DESCRIPTION OF PREFERRED EMBODIMENTS

Figure 1:
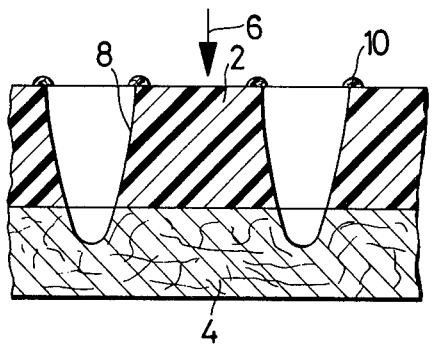
FIG. 1 is a schematic cross-section representation, not to scale, of artificial leather perforated according to the hitherto known process.

FIG. 1 shows artificial leather which has an essentially impervious top layer 2, for example from polyvinylchloride or foamed polyurethane, and a gas pervious support layer 4 from fleece or cloth. This artificial leather was perforated with the top side 2 turned towards beam 6, whereby according to the hitherto existing methods the intensity was positioned so that the perforation bores ended in the support layer 4. On account of the conicity of the beam and the beam intensity decreasing with increasing perforation depth, perforation bores 8 result in running conically inwards. The gas perviousness is not only conditioned by the resistance to flow of the hole section in the top layer 2, but also essentially through the resistance to flow which is offered by the still undamaged parts of the support layer 4. Since the beam on entry into the top layer still has its full intensity, visible incrustations and discolourations 10 on the hole edges cannot be avoided. Normally, it is necessary to remove such incrustations and discolourations by means of a cleaning process.

Figure 2:
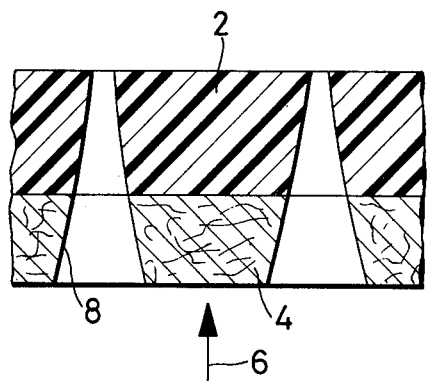
FIG. 2 is a similar representation of artificial leather perforated according to the process of the present invention.

FIG. 2 shows artificial leather perforated according to the process of the present invention, which leather again consists of a top layer 2 and a support layer 4. During perforation however, support layer 4 was turned towards beam 6, so that the full beam intensity acts on the support side and the holes correspondingly have the opposite conicity to the case of FIG. 1, whereby in both cases the conicity which is normally associated with the working beam naturally also works increasingly. The beam intensity in the case of FIG. 2 is positioned so that the holes arising on the top side of the top layer 2 are relatively small. Since the beam has lost its intensity considerably there, no noticeable incrustations and discolourations appear. Through clearing of the support layer in the whole route of perforation the resistance to flow of the perforation holes 8 formed is correspondingly low, so that smaller hole diameters and/or hole densities are sufficient.

Figure 3:
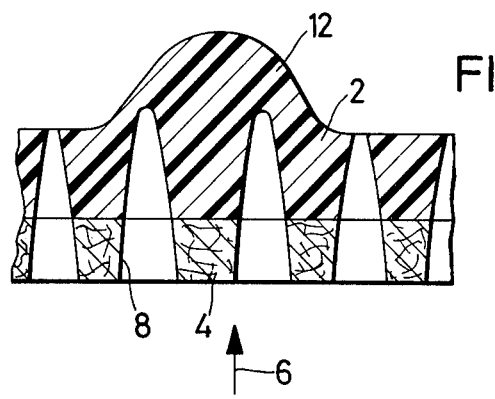
FIG. 3 is a similar representation to FIGS. 1 and 2 of another example of impressed artificial leather perforated according to the process of the present invention.

FIG. 3 shows artificial leather which again consists of a top layer 2 and a support layer 4, in which an elevation 12 has been formed through an impression process, as is done for example with shoe upper parts for imitating seams and the like. It will be seen that with perforation according to the invention with support side 4 turned towards beam 6 and similar positioning of the beam intensity as in the case of FIG. 2 the elevation 12 is not perforated as well. Since the perforation openings are often easier to recognise at the elevations than on other parts of a shoe top part, keeping the elevations free from perforation openings is advantageous. With the hitherto existing process, if the perforation of the elevations was to be avoided, masking templates correspondingly cut to size had to be used, whih had to be changed according to the fashion style of the elevations. This necessity does not arise with perforation according to the present invention.

What is claimed is:

1. A process for perforating a multilayered artificial leather product by the energy beam emitted from a beam source, said leather product having a top layer formed of an essentially impervious material joined to a pervious support layer, said process comprising the steps of:
   orienting the leather product so that the support layer is toward the beam source; and
   applying the energy beam to the support layer to completely perforate the support layer and to perforate the impervious layer.

2. The process according to claim 1 wherein the perforating characteristics of the energy beam are controllable and the process is further defined as controlling the energy beam characteristics so that the perforation openings produced on the exterior of the impervious layer do not exceed a predetermined dimension.

3. The process according to claim 2 wherein the applying step is further defined as applying the energy beam to the support layer for forming truncated conical holes which become narrow toward the exterior of the impervious layer.

4. The process according to claim 3 wherein the energy beam is conical and wherein the applying step is further defined as applying a conical energy beam to the support layer to perforate the support layer and the impervious layer with holes which become narrow toward the exterior of the impervious layer.

5. The process according to claim 1 wherein the step of applying the energy beam if further defined as applying an electron beam to the support layer.

6. The process according to claim 5 wherein the applying step is further defined as applying the electron beam to the support layer for forming truncated conical holes which become narrow toward the exterior of the impervious layer.

7. The process according to claim 1 wherein the pervious support layer is formed of cloth and the process is further defined as applying the energy beam to the cloth support layer.

8. The process according to claim 1 wherein the support layer comprises fleece and the process is further defined as applying the energy beam to the fleece support layer.

9. The process according to claim 1 wherein the artificial leather product has a portion in which the top layer is of increased thickness and wherein the perforating characteristic of the energy beam are controllable and the process is further defined as controlling the energy beam characteristics for perforating the thin portion of the top layer but not the thickened portion.

10. An artificial leather product comprising a first layer formed of an essentially impervious material joined to a second, support layer formed of a pervious material, said layers containing perforations extending through the layers of the product for rendering the product more similar to natural leather, said perforations being shaped as smooth truncated cones extending completely through the support layer and tapering toward openings of predetermined dimensions on the exterior surface of said first layer.

11. The artificial leather product according to claim 10 wherein said first layer has a portion of increased thickness and wherein said perforations do not extend through the thickened portion of said first layer.

12. The artificial leatherproduct according to claim 10 wherein said support layer comprises cloth.

13. The artificial leather product according to claim 10 wherein said second, support layer, comprises fleece.

* * * * *